(12) United States Patent
Hu et al.

(10) Patent No.: US 7,713,839 B2
(45) Date of Patent: May 11, 2010

(54) DIAMOND SUBSTRATE FORMATION FOR ELECTRONIC ASSEMBLIES

(75) Inventors: Chuan Hu, Chandler, AZ (US); Gregory M. Chrysler, Chandler, AZ (US); Daoqiang Lu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1138 days.

(21) Appl. No.: 10/960,303

(22) Filed: Oct. 6, 2004

(65) Prior Publication Data

US 2006/0073640 A1   Apr. 6, 2006

(51) Int. Cl.
H01L 21/30 (2006.01)

(52) U.S. Cl. .................. 438/458; 438/105; 438/118; 257/E21.57; 148/DIG. 12

(58) Field of Classification Search .................. 438/118, 438/458, 105, FOR. 106, FOR. 340; 257/E21.57; 148/DIG. 12
See application file for complete search history.

(56) References Cited

U.S. PATENT DOCUMENTS

| | | | |
|---|---|---|---|
| 4,582,954 A | 4/1986 | Eaton et al. ................... 174/16 |
| 5,180,571 A | 1/1993 | Hosoya et al. ............... 423/446 |
| 5,350,662 A | 9/1994 | Chi ............................. 430/313 |
| 5,906,042 A | 5/1999 | Lan et al. ....................... 29/852 |
| 5,962,815 A | 10/1999 | Lan et al. ..................... 174/262 |
| 6,153,938 A | 11/2000 | Kanda et al. ................. 257/778 |
| 6,504,242 B1 | 1/2003 | Deppisch et al. ............ 257/707 |
| 6,504,723 B1 | 1/2003 | Fitzgerald et al. ........... 361/705 |
| 6,549,407 B1 | 4/2003 | Sauciuc et al. ............... 361/699 |
| 6,653,730 B2 | 11/2003 | Chrysler et al. .............. 257/704 |
| 6,706,562 B2 | 3/2004 | Mahajan et al. ............. 438/125 |
| 6,709,898 B1 | 3/2004 | Ma et al. ..................... 438/122 |
| 6,751,099 B2 | 6/2004 | Vrtis et al. ................... 361/705 |
| 6,770,966 B2 | 8/2004 | Chrysler et al. ............. 257/706 |
| 6,813,153 B2 | 11/2004 | Koning et al. ............... 361/700 |
| 6,833,289 B2 | 12/2004 | Hu et al. ...................... 438/121 |
| 6,841,413 B2 | 1/2005 | Liu et al. ..................... 438/106 |
| 6,867,978 B2 | 3/2005 | Whittenburg et al. ....... 361/719 |
| 6,919,525 B2 | 7/2005 | Pinneo ................... 219/121.38 |
| 6,924,170 B2 | 8/2005 | Ravi et al. ................... 438/105 |

(Continued)

OTHER PUBLICATIONS

U.S. Appl. No. 11/173,834, Hu et al., entitled "Formation Of Assemblies With A Diamond Heat Spreader", published as US 20070004216 A1 (filed Jun. 30, 2005, publication date Jan. 4, 2007).

*Primary Examiner*—N Drew Richards
*Assistant Examiner*—Joannie A Garcia
(74) *Attorney, Agent, or Firm*—Konrad Raynes & Victor, LLP; Alan S. Raynes

(57) ABSTRACT

Electronic assemblies and methods for forming assemblies including a diamond substrate are described. One embodiment includes providing a diamond support and forming a porous layer of $SiO_2$ on the diamond support. A diamond layer is formed by chemical vapor deposition on the porous layer so that the porous layer is between the diamond support and the diamond layer. A polycrystalline silicon layer is formed on the diamond layer. The polycrystalline silicon layer is polished to form a planarized surface. A semiconductor layer is coupled to the polysilicon layer. After coupling the semiconductor layer to the polysilicon layer, the diamond support is detached from the diamond layer by breaking the porous layer. The semiconductor layer on the diamond layer substrate is then further processed to form a semiconductor device.

20 Claims, 5 Drawing Sheets

U.S. PATENT DOCUMENTS

| | | | |
|---|---|---|---|
| 6,936,497 B2 * | 8/2005 | Ravi et al. | 438/105 |
| 7,033,912 B2 * | 4/2006 | Saxler | 438/458 |
| 7,036,573 B2 | 5/2006 | Koning et al. | 165/185 |
| 7,038,277 B2 * | 5/2006 | Chu et al. | 257/347 |
| 7,056,810 B2 * | 6/2006 | Yamazaki et al. | 438/458 |
| 7,132,309 B2 * | 11/2006 | Sung | 438/105 |
| 7,153,725 B2 | 12/2006 | Wang et al. | 438/122 |
| 2002/0056909 A1 | 5/2002 | Kwon et al. | 257/720 |
| 2002/0074649 A1 | 6/2002 | Chrysler et al. | 257/720 |
| 2002/0105071 A1 | 8/2002 | Mahajan et al. | 257/720 |
| 2002/0141155 A1 | 10/2002 | Pinneo | 257/678 |
| 2003/0117775 A1 | 6/2003 | Vrtis et al. | 361/705 |
| 2003/0127715 A1 | 7/2003 | Liu et al. | 257/678 |
| 2003/0132433 A1 * | 7/2003 | Piner et al. | 257/19 |
| 2003/0150604 A1 | 8/2003 | Koning et al. | 165/185 |
| 2004/0029359 A1 * | 2/2004 | Letertre et al. | 438/458 |
| 2004/0052050 A1 | 3/2004 | Koning et al. | 361/700 |
| 2004/0066630 A1 | 4/2004 | Whittenburg et al. | 361/719 |
| 2004/0233583 A1 * | 11/2004 | Yanagisawa | 360/294.7 |
| 2005/0161780 A1 | 7/2005 | Wang et al. | 257/678 |
| 2006/0046088 A1 * | 3/2006 | Akram et al. | 428/620 |
| 2007/0004216 A1 | 1/2007 | Hu et al. | 438/713 |

* cited by examiner

DIAMOND SUBSTRATE FORMATION FOR ELECTRONIC ASSEMBLIES

RELATED ART

Electronic devices typically include integrated circuits formed on semiconductor materials such as silicon. Semiconductor wafers may be processed to form various electronic devices having integrated circuits and diced into bulk semiconductor chips. Silicon-on-insulator (SOI) structures have been developed as an alternative to bulk silicon device technology. In general, SOI fabrication processes result in increased packing densities, improved performances, better device isolations and reduced extrinsic parasitic elements, particularly those of the source and drain as well as leakage currents and thus significantly speeding up circuit operations. SOI substrates generally include a thin layer of silicon on top of an insulator, wherein circuit components are formed in and on the thin layer of silicon. The insulator can be formed from a variety of materials such as silicon oxide and sapphire.

As device integration increases, integrated circuits require cooling to sustain reliability of the circuits and interconnects, to optimize circuit switching performance, and to suppress thermally generated noise in the circuits. Elevated temperatures can result in significantly larger leakage currents. Moreover, as device dimensions decrease, leakage current grows exponentially. One way to conduct heat from an integrated circuit is through the use of a thermal layer coupled to the die. The thermal layer is designed to transmit heat away from the die.

BRIEF DESCRIPTION OF THE DRAWINGS

Embodiments are described by way of example, with reference to the accompanying drawings, which are not drawn to scale, wherein.

DETAILED DESCRIPTION

Certain embodiments relate to the formation of an assembly including a diamond substrate having a thin semiconductor layer thereon. Diamond is an advantageous material for thermal performance because it has a substantially higher thermal conductivity than copper or silicon. Diamond layers have been grown on silicon substrates. However, such diamond layers often have a high degree of warpage and thus are not suitable for the fabrication of devices such as transistors. Such warpage may be at least in part due to the thermal expansion mismatch between the silicon substrate and the diamond. The process for forming such a diamond layer requires relatively high temperatures and as such, the stresses developed due to the thermal expansion mismatch are substantial.

Figure 1:
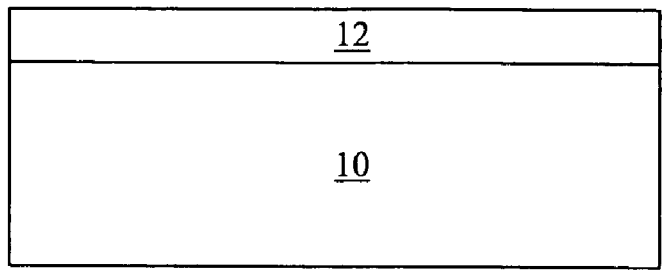
FIG. 1 illustrates a method including forming a porous layer on a diamond support in accordance with certain embodiments.
Figure 2:
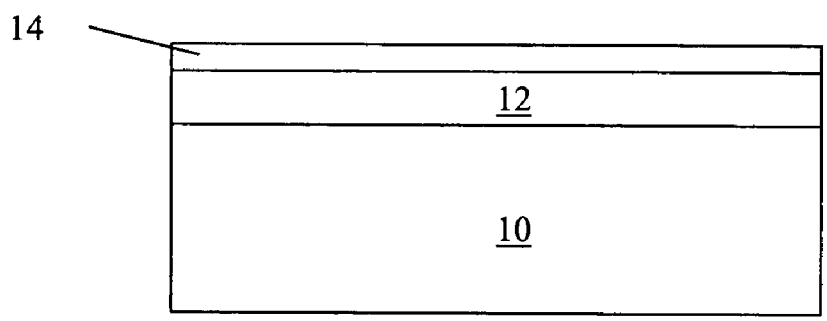
FIG. 2 illustrates a method including forming a diamond seed layer on the porous layer of FIG. 1, in accordance with certain embodiments.
Figure 3:
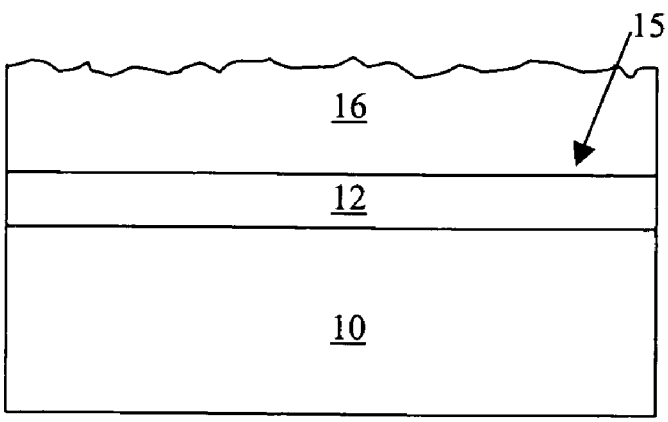
FIG. 3 illustrates a method including forming a diamond layer in accordance with certain embodiments.

FIGS. 1-3 illustrate a first embodiment of the present invention. As seen in FIG. 1, a layer 12 is formed on a diamond support substrate 10. The layer 12 is preferably a porous layer of material that can withstand relatively high processing temperatures used to form a diamond layer and that will enable such a diamond layer to be debonded from the diamond support substrate 10. Generally, the layer 12 should preferably be formed from a non-organic material that can withstand the processing temperatures used in a CVD process for forming a diamond layer. An example of a preferred material for the layer 12 is $SiO_2$. Another example of a material is silicon. The porosity may be in a preferred range of about 20 to 60 percent, with about 40 percent porosity being more preferred. The layer 12 is preferably formed to be considerably thinner than the diamond support substrate, with a preferred thickness in the range of about 1 μm to about 5 μm thick. The layer 12 also preferably has a coefficient of thermal expansion that is relatively close to that of diamond, to minimize stresses from thermal expansion mismatch.

As illustrated in FIG. 2, a substantially uniform seed layer 14 for the growth of polycrystalline diamond may be formed on the layer 12, using a process such as those known in the art, so that the layer 12 is intermediate between the diamond support substrate 10 and the seed layer 14. A diamond layer 16 is then formed on the seed layer 14, for example, using a chemical vapor deposition (CVD) process as known in the art. One example of such a CVD process includes a hot filament microwave plasma process at about 800-1200° C. Other processes for forming a diamond layer as known in the art may also be used. As seen in FIG. 3, the CVD diamond layer 16 is preferably formed to have a greater thickness than the layer 12. The diamond layer 16 is preferably formed to have a thickness in the range of about 100 μm to about 500 μm thick, with one preferred embodiment being about 300 μm thick.

Figure 4:
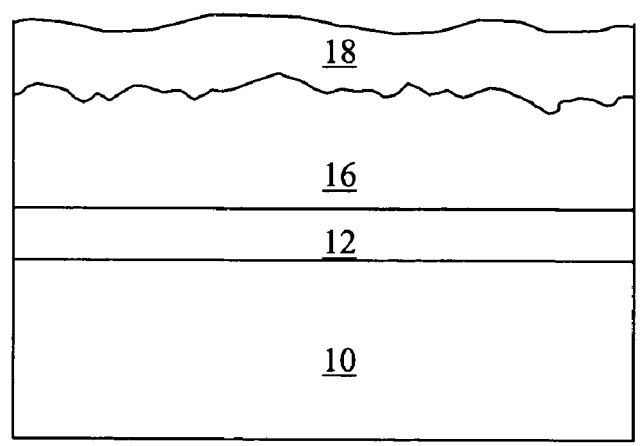
FIG. 4 illustrates a method including forming a layer on the diamond layer of FIG. 3, in accordance with certain embodiments.
Figure 5:
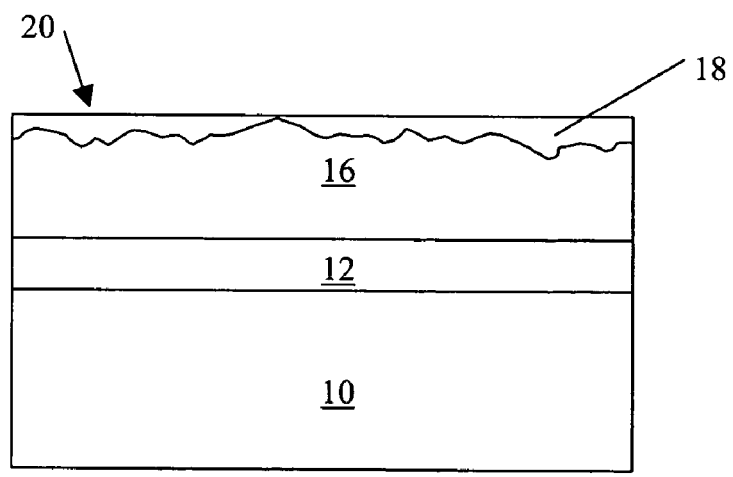
FIG. 5 illustrates a method including polishing the layer of FIG. 4, in accordance with certain embodiments.

As illustrated in FIG. 4, a layer 18 is then formed on the diamond layer 16. A preferred material for the layer 18 is polycrystalline silicon, formed to a preferred thickness in the range of up to about 20 μm, depending in part on the surface roughness of the CVD diamond layer 16. Such a layer 18 is also preferably formed to have a grain size greater than 1 μm. The layer 18 may serve to facilitate the bonding of another layer to the diamond layer 16 and to facilitate forming a flat surface. The layer 18 is polished, to yield a flat surface 20, as illustrated in FIGS. 4-5. It is preferred that the polishing does not expose the diamond layer 16.

Figure 6:
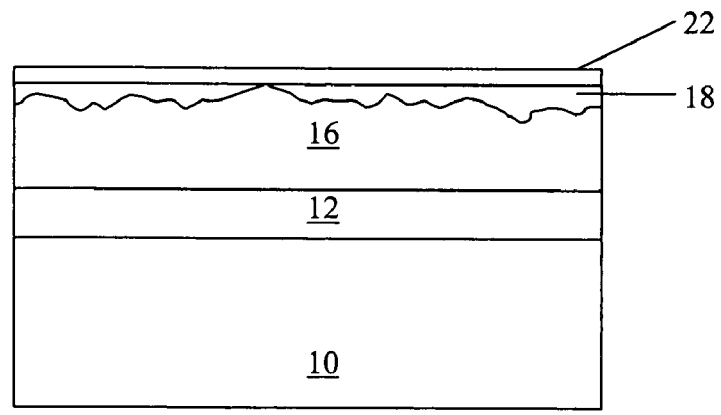
FIG. 6 illustrates a method including providing a semiconductor layer on the polished surface of FIG. 5, in accordance with certain embodiments.

As illustrated in FIG. 6, a die layer 22 is formed on the surface 20 of the layer 18. The die layer 22 is preferably a thin die having a preferred thickness of up to about 3 μm, with a more preferred thickness of about 1 μm, although depending on various factors (such as the device to be formed, the materials used, etc.), other thicknesses may be used. The die layer 22 may be separately formed and then transferred to the surface 20. Alternatively, the die layer 22 may be deposited or grown on the surface 20. The die layer 22 may in certain embodiments be a single crystal silicon layer that has not yet been processed into an integrated circuit. Such a single crystal silicon layer may be bonded to the surface 20 using known methods.

Figure 7:
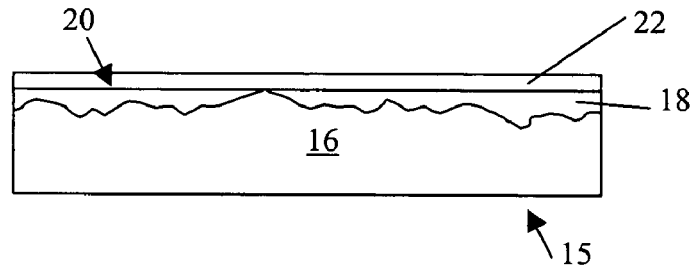
FIG. 7 illustrates a method including separating the diamond support and porous layer from the rest of the assembly, in accordance with certain embodiments.
Figure 8:
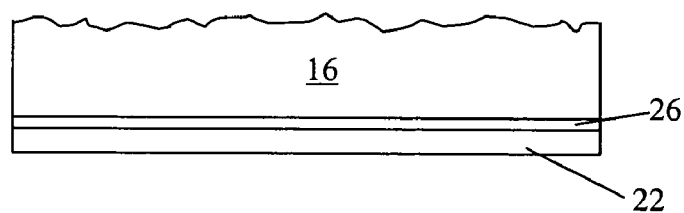
FIG. 8 illustrated a method including providing a semiconductor layer on an adhesion layer on a surface of the diamond layer, in accordance with certain embodiments.

As illustrated in FIG. 7, the diamond support substrate 10 is separated from the CVD diamond layer through the layer 12, which, as noted earlier, in certain embodiments is preferably a porous $SiO_2$ layer. The separation may be carried out using a variety of techniques, including through the use of a liquid jet such as a water jet as known in the art to cut through the layer 12. The remaining structure includes the CVD diamond layer 16 having the die layer 22 thereon. The separation of the diamond support layer 10 from the CVD diamond layer 16 may also be carried out using other techniques as known in the art, including, but not limited to, cleaving and mechanical shock.

After the diamond support substrate 10 is separated from the diamond layer 16 having the die layer 22 thereon, any remaining porous $SiO_2$ on the diamond layer 16 or on the diamond support substrate 10 thereon may be cleaned or polished off. Depending on whether the die layer 22 has been processed into an electronic device, additional processing may then be carried out on the die layer 22. The diamond support substrate 10 may also be reused.

Another embodiment can be described with reference to FIGS. 1-3 and FIG. 8. As described above for FIGS. 1-3, a layer 12 is formed on a diamond support substrate 10. The layer 12 may preferably be a porous $SiO_2$ layer. A diamond layer 16 (such as a CVD diamond layer) is then formed on the layer 12. The diamond layer 16 may be formed by first depositing a seed layer 14 and then growing the diamond layer, using a known method as described above. The resultant structure appears in FIG. 3, and includes the layer 12 positioned between the diamond support substrate 10 and the diamond layer 16.

As described above, it is possible to detach the diamond support substrate from the diamond layer 16 by breaking through the layer 12, which is preferably a porous layer of $SiO_2$. Depending on the method used to cut through the layer 12 (e.g., water jet, cleaving, mechanical shock), the surface 15 of the diamond layer 16 may be of sufficient flatness so that it can be bonded to a die layer 22 without performing an additional polishing operation. Thus, as seen in this embodiment, a die layer 22 is positioned on the surface 15 of the diamond layer 16, whereas in the embodiment illustrated in FIG. 7, the diamond is positioned on the polished surface 20 on the other side of the diamond layer 16. In certain embodiments, an optional adhesion layer 26 may be formed on the diamond layer surface 15, if desired, to aid in the adhesion of the die layer 22 to the diamond layer 16. Such an adhesion layer may be formed from a material such as a metal or a metal compound. Specific examples include, for example, titanium, titanium nitride, silicon oxide, and a variety of solders. The die layer 22 may be separately formed and then coupled to the diamond layer surface 15. Alternatively, the die layer 22 may be deposited or grown on the surface 15. The die layer 22 may in certain embodiments be a single crystal silicon layer that has not yet been processed into an integrated circuit. Such a single crystal silicon layer may be bonded to the surface 15 using known methods, and, as noted above, may be bonded to the surface 15 through an adhesion layer 26.

Figure 9:
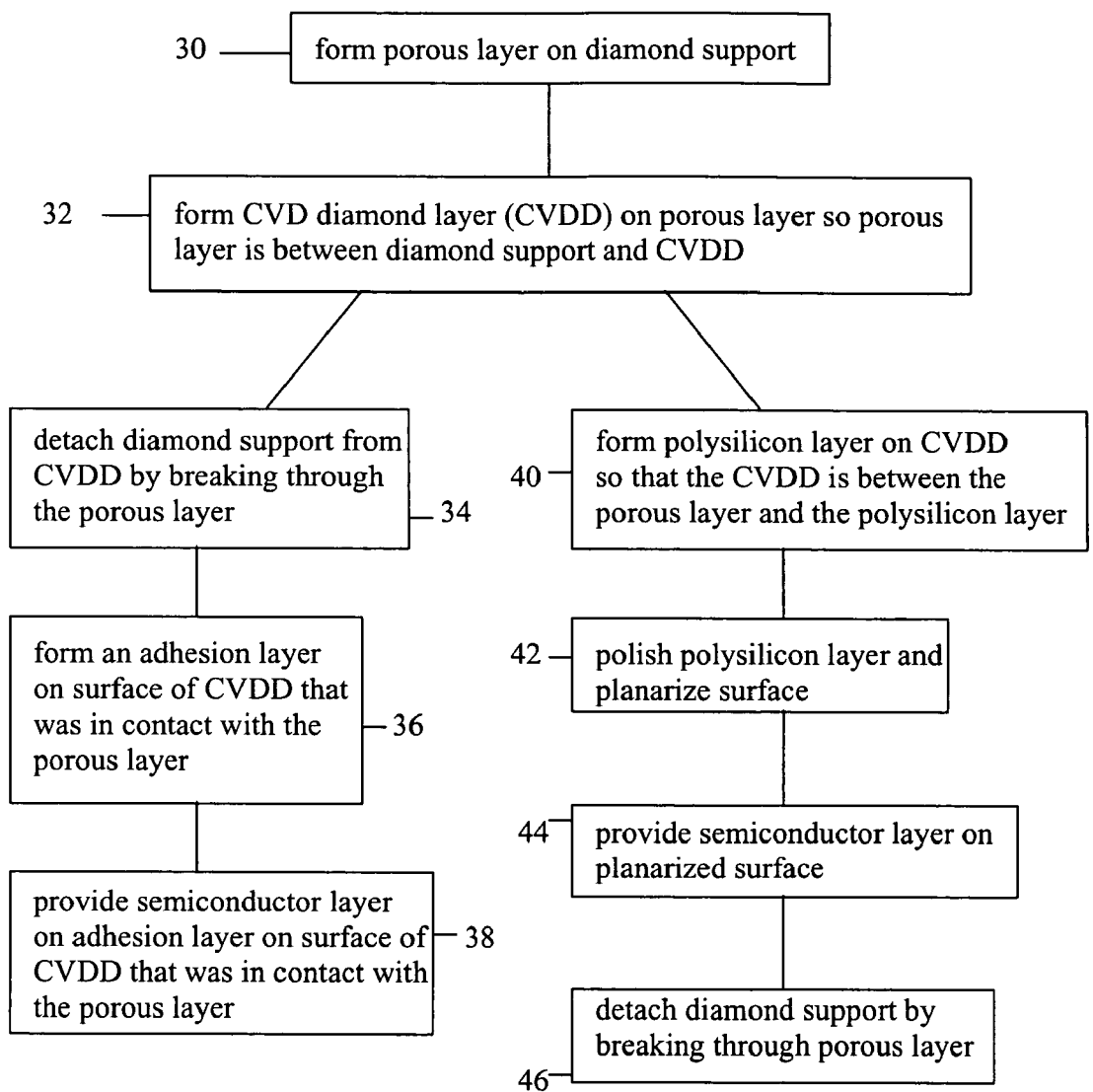
FIG. 9 is a flowchart illustrating operations in accordance with certain embodiments.

FIG. 9 illustrates embodiments in flow chart form including methods for forming an assembly including a semiconductor layer on a diamond support. Block 30 is forming a porous layer (such as $SiO_2$) on a preexisting diamond support. Block 32 is forming a CVD diamond layer (CVDD) on the porous layer so that the porous layer is positioned between the diamond support and the CVD diamond layer. Blocks 34-38 relate to an embodiment in which the diamond support is separated from the CVD diamond layer prior to providing a semiconductor layer on a surface of the CVD diamond layer. Blocks 40-46 relate to an embodiment in which the diamond support is separated from the CVD diamond layer after providing a semiconductor layer on a different surface of the CVD diamond layer.

Block 34 is detaching the diamond support from the CVD diamond layer by breaking through the porous layer. Block 36 is forming an adhesion layer on the surface of the CV diamond layer that was in contact with the porous layer prior to removal of the porous layer. Block 38 is providing a semiconductor layer on the adhesion layer on the surface of the CVD diamond layer that was in contact with the porous layer.

Block 40 is forming a polysilicon layer on the CVD diamond layer so that the CVD diamond layer is positioned between the porous layer and the polysilicon layer. Block 42 is polishing the polysilicon layer and forming a planarized surface including the polished polysilicon layer. Block 44 is providing a semiconductor layer on the planarized surface. Block 46 is detaching the diamond support by breaking through the porous layer.

The embodiments described above yield a CVD diamond substrate layer having a semiconductor layer thereon. Such a structure can be formed to be thinner than conventional silicon-on-insulator structures.

Figure 10:
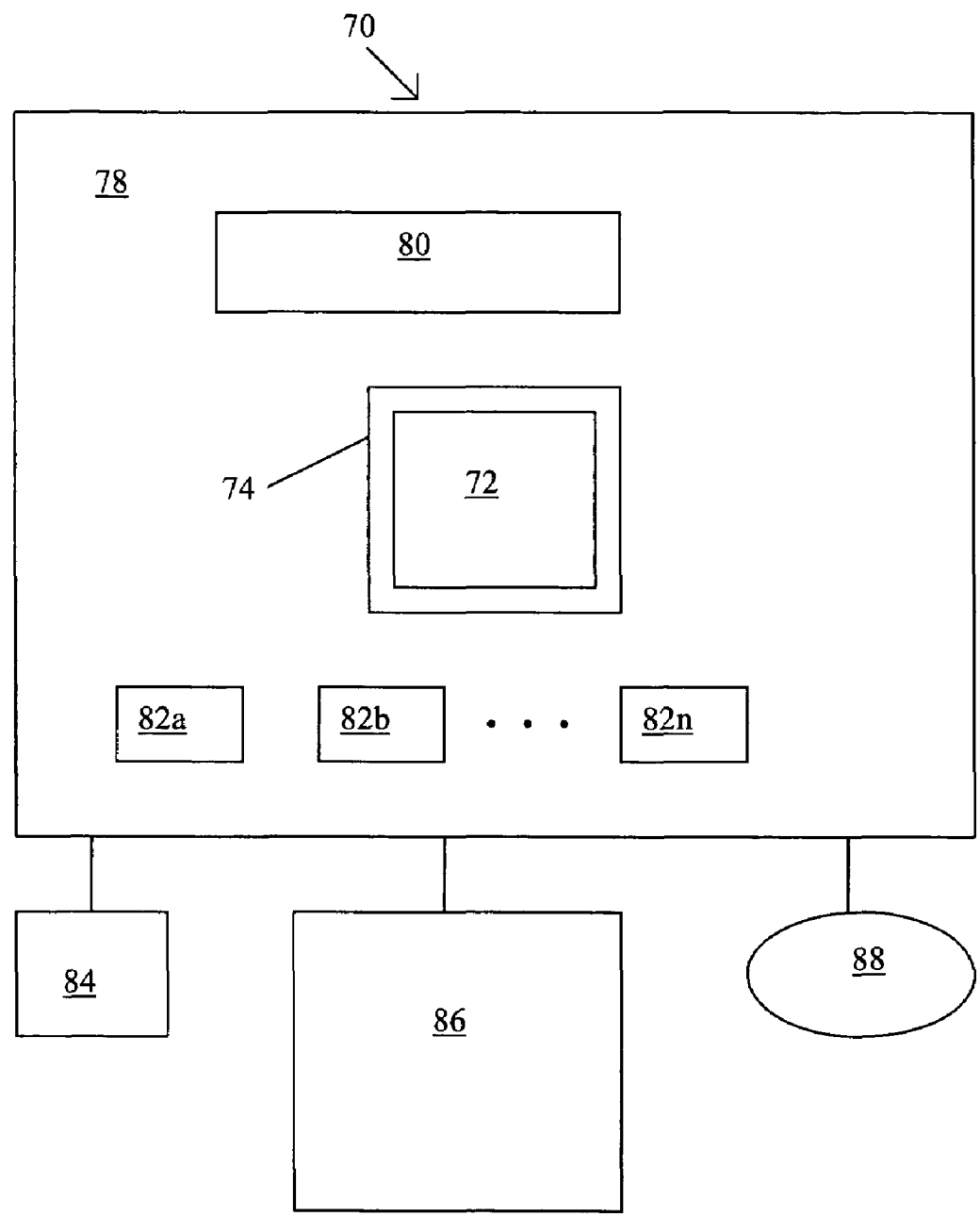
FIG. 10 illustrates one embodiment of a computing environment in which aspects of the description provided herein are embodied.

FIG. 10 illustrates one example of a computing environment in which aspects of described embodiments may be embodied. The computing environment includes a computer 70 including at least one central processing unit (CPU) 72. The CPU 72, also referred to as a microprocessor, may be attached to an integrated circuit package 74 which is then coupled to a printed circuit board 78, which in this embodiment, is a motherboard. The CPU 72 is an example of an assembly including a die layer 22 formed on a diamond substrate layer 16 as described earlier.

The computer 70 further may further include memory 80 and one or more controllers 82*a*, 82*b* . . . 82*n* which are also disposed on the motherboard 78. The motherboard 78 may be a single layer or multi-layered board which has a plurality of conductive lines that provide communication between the circuits in the package 74 and other components mounted to the board 78. Alternatively, one or more of the CPU 72, memory 80 and controllers 82*a*, 82*b* . . . 82*n* may be disposed on other cards such as daughter cards or expansion cards. The CPU 72, memory 80 and controllers 82*a*, 82*b* . . . 82*n* may each be seated in individual sockets or may be connected directly to a printed circuit board. A display 86 may also be included.

Any operating system and various applications as known in the art execute on the CPU 72 and reside in the memory 80. The content residing in memory 80 may be cached in accordance with known caching techniques. Programs and data in memory 80 may be swapped into storage 84 as part of memory management operations. The computer 70 may comprise any computing device known in the art, such as a mainframe, server, personal computer, workstation, laptop, handheld computer, telephony device, network appliance, virtualization device, storage controller, network controller, etc.

The controllers 82*a*, 82*b* . . . 82*n* may include a system controller, peripheral controller, memory controller, hub controller, I/O bus controller, video controller, network controller, storage controller, etc. For example, a storage controller can control the reading of data from and the writing of data to the storage 84 in accordance with a storage protocol layer. The storage protocol of the layer may be any of a number of known storage protocols. Data being written to or read from the storage 84 may be cached in accordance with known caching techniques. A network controller can include one or more protocol layers to send and receive network packets to and from remote devices over a network 88. The network 88 may comprise a Local Area Network (LAN), the Internet, a Wide Area Network (WAN), Storage Area Network (SAN), etc. Embodiments may be configured to transmit data over a wireless network or connection. In certain embodiments, the network controller and various protocol layers may employ the Ethernet protocol over unshielded twisted pair cable, token ring protocol, Fibre Channel protocol, etc., or any other network communication protocol known in the art.

While certain exemplary embodiments have been described above and shown in the accompanying drawings, it is to be understood that such embodiments are merely illustrative and not restrictive of the current invention, and that this invention is not restricted to the specific constructions and arrangements shown and described since modifications may occur to those having ordinary skill in the art.

What is claimed:

1. A method of forming a semiconductor device, comprising:
   providing a diamond substrate;
   forming an intermediate layer on the diamond substrate;
   forming a diamond layer on the intermediate layer so that the intermediate layer is between the diamond substrate and the diamond layer, the diamond layer having a first surface in contact with the intermediate layer;
   separating the diamond layer from the intermediate layer and the diamond substrate; and
   after the separating the diamond layer, coupling a semiconductor layer to the first surface of the diamond layer.

2. A method as in claim 1, further comprising coupling the semiconductor layer to the first surface of the diamond layer through an adhesion layer, wherein the adhesion layer is formed in direct contact with the first surface of the diamond layer.

3. A method as in claim 1, further comprising coupling the semiconductor layer to the first surface of the diamond layer through a layer selected from the group consisting of metals and metal compounds.

4. A method as in claim 1, further comprising using a liquid jet stream for breaking the intermediate layer.

5. A method as in claim 1, further comprising forming the intermediate layer from a material selected from the group consisting of $SiO_2$ and Si.

6. A method as in claim 1, further comprising forming the intermediate layer to have a porosity in the range of 20 percent to 60 percent.

7. A method as in claim 1, further comprising forming the diamond layer on the intermediate layer using a chemical vapor deposition process using temperatures in the range of 800° C.-1200° C.

8. A method as in claim 1, further comprising forming the semiconductor layer from a single crystal silicon layer.

9. A method as in claim 1, further comprising forming the diamond layer to have a thickness in the range of 200-400 μm, and providing the semiconductor layer with a thickness of no greater than 3 μm.

10. A method as in claim 1, further comprising forming the intermediate layer from a material comprising $SiO_2$ and forming the intermediate layer to have a thickness in the range of 1-5 μm.

11. The method of claim 1, wherein the coupling the semiconductor layer to the first surface of the diamond layer includes the semiconductor layer being in direct contact with the first surface of the diamond layer.

12. A method of forming a semiconductor device, comprising:
    providing a diamond substrate;
    forming a porous layer having a thickness of 1-5 μm on the diamond substrate, the porous layer having a porosity in the range of 20 percent to 60 percent;
    forming a diamond layer on the porous layer so that the porous layer is between the diamond substrate and the diamond layer, the diamond layer having a first surface in contact with the porous layer;
    separating the diamond layer from the porous layer and the diamond substrate; and
    after the separating the diamond layer from the porous layer and the diamond substrate, coupling a semiconductor layer to the first surface of the diamond layer.

13. A method as in claim 12, further comprising coupling the semiconductor layer to the first surface of the diamond layer by growing the semiconductor layer on the first surface of the diamond layer.

14. A method as in claim 12, wherein the coupling a semiconductor layer to the first surface of the diamond layer comprises forming an adhesion layer in direct contact with on the first surface of the diamond layer and then providing the semiconductor layer on the adhesion layer.

15. A method of forming a semiconductor device, comprising:
    providing a diamond substrate;
    forming an intermediate layer on the diamond substrate;
    after the forming the intermediate layer on the diamond substrate, forming a diamond layer on the intermediate layer so that the diamond layer is coupled to the diamond substrate through the intermediate layer, wherein the diamond layer includes a first surface facing the intermediate layer;
    after the forming the diamond layer on the intermediate layer, separating the diamond layer from the intermediate layer and the diamond substrate; and
    after the separating the diamond layer from the intermediate layer and the diamond substrate, coupling a semiconductor layer to the diamond layer.

16. The method of claim 15, further comprising forming the intermediate layer from a material comprising $SiO_2$.

17. The method of claim 15, further comprising forming the intermediate layer to have a porosity in the range of 20 to 60 percent.

18. The method of claim 15, wherein the coupling a semiconductor layer to the diamond layer comprises coupling a semiconductor layer to the first surface of the diamond layer.

19. The method of claim 15, wherein the coupling a semiconductor layer to the first surface of the diamond layer comprises forming an adhesion layer in direct contact with the first surface of the diamond layer and then providing the semiconductor layer on the adhesion layer.

20. The method of claim 15, wherein the coupling a semiconductor layer to the first surface of the diamond layer comprises coupling a single crystal silicon layer to the first surface of the diamond layer.

* * * * *

UNITED STATES PATENT AND TRADEMARK OFFICE
CERTIFICATE OF CORRECTION

| | | |
|---|---|---|
| PATENT NO. | : 7,713,839 B2 | Page 1 of 1 |
| APPLICATION NO. | : 10/960303 | |
| DATED | : May 11, 2010 | |
| INVENTOR(S) | : C. Hu et al. | |

It is certified that error appears in the above-identified patent and that said Letters Patent is hereby corrected as shown below:

In the Claims

Column 6, Lines 26-27, "with on the first" should read --with the first--.

Signed and Sealed this

Thirteenth Day of January, 2015

Michelle K. Lee
*Deputy Director of the United States Patent and Trademark Office*